United States Patent [19]

Strid et al.

[11] Patent Number: 5,068,615

[45] Date of Patent: Nov. 26, 1991

[54] NOISE PARAMETER TEST APPARATUS

[75] Inventors: Eric W. Strid, Portland; Bernard W. Leake, Beaverton, both of Oreg.

[73] Assignee: Cascade Microtech, Inc., Beaverton, Oreg.

[21] Appl. No.: 539,732

[22] Filed: Jun. 18, 1990

Related U.S. Application Data

[62] Division of Ser. No. 262,463, Oct. 25, 1988, Pat. No. 4,998,071.

[51] Int. Cl.$^5$ .............................................. G01R 27/28
[52] U.S. Cl. ................................... 324/613; 324/612; 333/101
[58] Field of Search ............................... 324/612–614, 324/636, 637, 601, 158 T; 455/67, 135, 226; 333/101, 103, 104, 1.1, 109

[56] References Cited

U.S. PATENT DOCUMENTS

| | | | |
|---|---|---|---|
| 3,611,199 | 10/1971 | Safran | 333/109 |
| 4,502,028 | 2/1985 | Leake | 324/58 R |

OTHER PUBLICATIONS

"IRE Standards on Methods of Measuring Noise in Linear Two Ports, 1959".
Proc. IRE, vol. 48, pp. 60–68, Jan. 1960, H. Fukui "Available Power Gain, Noise Figure, and Noise Measure of Two-Ports and Their Graphical Representations".
IEEE Trans. Circuit Theory, vol. CT-13, pp. 137–142, Jun. 1966, Richard Lane, "The Determination of Device Noise Parameters".
Proc. IEEE, vol. 57, pp. 1461–1462, Aug. 1969.
Vahé Adamian and Arthur Uhlir, Jr., "Simplified Noise Evaluation of Microwave Receivers".
IEEE Transactions on Instrumentation and Measurement, vol. IM-33, No. 2, Jun. 1984, Victor Larock and Rene Meys "Automatic Noise Temperature Measurement Through Frequency Variation".
IEEE Transactions on Microwave Theory and Techniques, vol. MTT-30, No. 8, Aug. 1982.

Primary Examiner—Jack B. Harvey
Attorney, Agent, or Firm—Chernoff, Vilhauer, McClung & Stenzel

[57] ABSTRACT

A one port tuner having a source port for connection to a device under test so that, in combination with a noise meter, the noise performance of such device can be evaluated. Preferably the one port tuner includes a plurality of predetermined admittances, a switching device having an output port for selectively connecting one of the admittances to the output port, and a two port device having a selectable response and interconnected between the output port of the switching device and the source port of the one port tuner. Desirably, the two port device includes a multiple-state attenuator where the signal passing through the attenuator is selectable in degree. Alternatively, or in combination, the two port device includes a phase shifter where the phase of the signals passing through the phase shifter are selectively shiftable. Optionally, the one port tuner includes a variable amplifier, variable phase shifter, and variable bandpass filter in serial connection with each other where the two legs of the serial connection are coupled to the source port by a signal feedthrough device.

10 Claims, 10 Drawing Sheets

NOISE PARAMETER TEST APPARATUS

This is a divisional of co-pending application Ser. No. 07/262,463 filed on Oct. 25, 1988 now U.S. Pat. No. 4,998,071.

TECHNICAL FIELD

The present invention relates to the field of noise parameter testing. More specifically, the present invention relates to determining the noise parameters of a device under test (DUT) by measuring simultaneously the DUT's noise power within different, closely spaced, narrow frequency ranges. The invention also relates to one-port tuners for use in noise power measurements within different frequency ranges.

BACKGROUND OF THE INVENTION

When a signal passes through a network, the network adds noise to the signal. Because noise limits the amount of information a signal having a given power can contain, noise minimization is often desired in limited signal power situations, for example, satellite communications.

A standard measure for the amount of noise added to a signal by a two-port network is termed "noise factor" ("noise figure" when measured in decibels), and is defined in "IRE Standards on Methods of Measuring Noise in Linear Twoports, 1959," 59 IRE 20. S1, *Proc. IRE*, vol. 48, pp. 60–68, January 1960, reprinted in *Low-Noise Microwave Transistor & Amplifiers* IEEE Press, 1981:

"The noise factor, at a specified input frequency, is defined as the ratio of (1) the total noise power per unit bandwidth at a corresponding output frequency available at the output port when the noise temperature of the input termination is standard (290K) to (2) that portion of (1) engendered at the input frequency by the input termination."

The noise factor F of a two-port network is a function of the source admittance $Y_s$ and varies according to the equation $$F = F_0 + \frac{R_n}{G_s} |Y_s - Y_0|^2. \quad (1)$$

$F_0$ is the network's "optimum noise factor" and is the minimum noise factor which may be achieved by setting the source admittance $Y_s$ to an optimum admittance $Y_0$. $R_n$ is a parameter having the units of resistance, and $G_s$ is the real or conductance component of the complex source admittance $Y_s$, the imaginary component $B_s$ being susceptance. Since $Y_s = G_s + jB_s$ and $Y_0 = G_0 + jB_0$, equation (1) may be rewritten as $$F = F_0 + \frac{R_n}{G_s} [(G_s - G_0)^2 + (B_s - B_0)^2]. \quad (2)$$

A network's noise performance at a given frequency can be described by specifying its four noise parameters $F_0$, $G_0$, $B_0$, and $R_n$. These four parameters are independent of the source and load terminations. A graph of noise factor F on the rectangular source admittance plane is shown in FIG. 1.

Noise factor F also may be graphed on the complex reflective coefficient plane, i.e., a Smith chart, as described by H. Fukui in "Available Power Gain, Noise Figure, and Noise Measure of Two-Ports and Their Graphical Representation," IEEE Trans. Circuit Theory, vol. CT-13, pp. 137–142, June 1966, and also reprinted in *Low-Noise Microwave Transistors & Amplifiers*. A Smith chart having circles representing source reflection coefficients which yield constant noise figures for a hypothetical DUT is shown in FIG. 2.

A DUT's noise parameters for a given frequency can be calculated from the DUT's noise factor at the same frequency for four different source admittances. Due to inevitable errors in measurement and possible singular solutions, preferably more than four measurements are made and the noise parameters are calculated using a fitting method, one method being described by Richard Q. Lane in "The Determination of Device Noise Parameters," Proc. IEEE, vol. 57, pp. 1461–1462, August 1969 which is also reprinted in *Low-Noise Microwave Transistor & Amplifiers*.

To assure accurate calculation of the noise parameters, and especially the minimum noise factor F0, some noise factor measurements should be taken which are not on the steep slope of the surface F shown in FIG. 1. To ensure this, the noise power should be measured for many different source admittances, or source reflection coefficients, such that the measurement points permeate the entire Smith chart. Such a pattern of measurement points on a Smith chart will be called hereinafter a "constellation."

In Leake, U.S. Pat. No. 4,502,028 an electrically controllable tuner is described. However, the tuner does not provide a constellation which fills the Smith chart; the points are concentrated in the center. Vahe Adamian and Arthur Uhlir, Jr. describe using off-set short circuits as the source admittance. ("Simplified Noise Evaluation of Microwave Receivers," *IEEE Transactions on Instrumentation and Measurement*, Vol. IM-33, No. 2, June 1984.) Unfortunately, such tuners only allow constellations with points on the edge of the Smith chart.

Larock and Meys describe a method of changing the source admittance in noise measurements by changing the measurement frequency a relatively small amount. ("Automatic Noise Temperature Measurement Through Frequency Variation," *IEEE Transactions on Microwave Theory and Techniques*, Vol. MTT-30, No. 8, August 1982.) A slight change in measurement frequency causes the measurement source admittance points to move in an arc around the center point of a Smith chart. With relatively small changes in measurement frequency, a measurement source admittance point may be moved full circle around the Smith chart.

Since noise parameters vary according to signal frequency, a complete noise parameter analysis requires multiple measurements of noise factor at multiple frequencies. Since noise is a random event, an accurate measurement of its power requires increasing time for decreasing bandwidth of measurement. Thus, accurate measurements of noise parameters can require significant time.

What is needed, then, is an improved method and apparatus for accurately measuring and calculating noise parameters of a two-port network while decreasing the time required for the measurements. Also needed is a method and apparatus for providing a broad constellation of source admittances, yielding more useful measurements of noise factor from which to calculate a DUT's noise parameters.

SUMMARY OF THE INVENTION

The present invention provides apparatus and means for simultaneously measuring a two-port device under test's (DUT's) noise power within different frequency ranges. The different frequency ranges are sufficiently close to a central frequency such that the DUT's noise performance is substantially the same as at the central frequency; slight frequency-dependent noise factor changes may be calculated and eliminated or ignored. The Smith chart representation of noise figure shown in FIG. 3 more clearly shows the frequency relationship between the source admittance and the noise factor. Since a DUT's noise factor does not vary rapidly with small changes in measurement frequency, the measurement frequency may be varied slight to alter the source admittance seen by the DUT's input port. For example, assume the source termination is a delay line having a length 5 nanoseconds and the measurement is 10 GHz. An exemplary source admittance is shown as point A in FIG. 3. Changing the frequency by 25 MHz to 10.025 GHz causes the reflection coefficient to move clockwise 90 degrees from point A to point B. Different changes in the source reflection coefficient may be achieved through corresponding changes in the measurement frequency.

In order to provide the desired broad constellation of reflection coefficients, other source terminations are used as well with this frequency shifting technique. For example, the delay line may be terminated with an open circuit, a short circuit to ground, or other arbitrary terminations.

Also, in accordance with the present invention, a plurality of noise power meters is connected to the DUT via a power divider. Each power meter is configured to measure noise power within closely spaced frequency ranges. The DUT's noise power is accordingly measured within each frequency range simultaneously, saving much measurement time.

It is therefore a principal object of the present invention to provide for measurement of a DUT's noise power for different source admittances within different frequency ranges simultaneously.

It is another principal object of the present invention to provide for simultaneous measurement of a DUT's noise figure for matched source admittance terminations within different frequency ranges.

It is yet another principal object of the present invention to provide a one-port tuner which produces various, predetermined source admittances and is usable with frequency shifting techniques in a broader constellation than has previously been possible.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
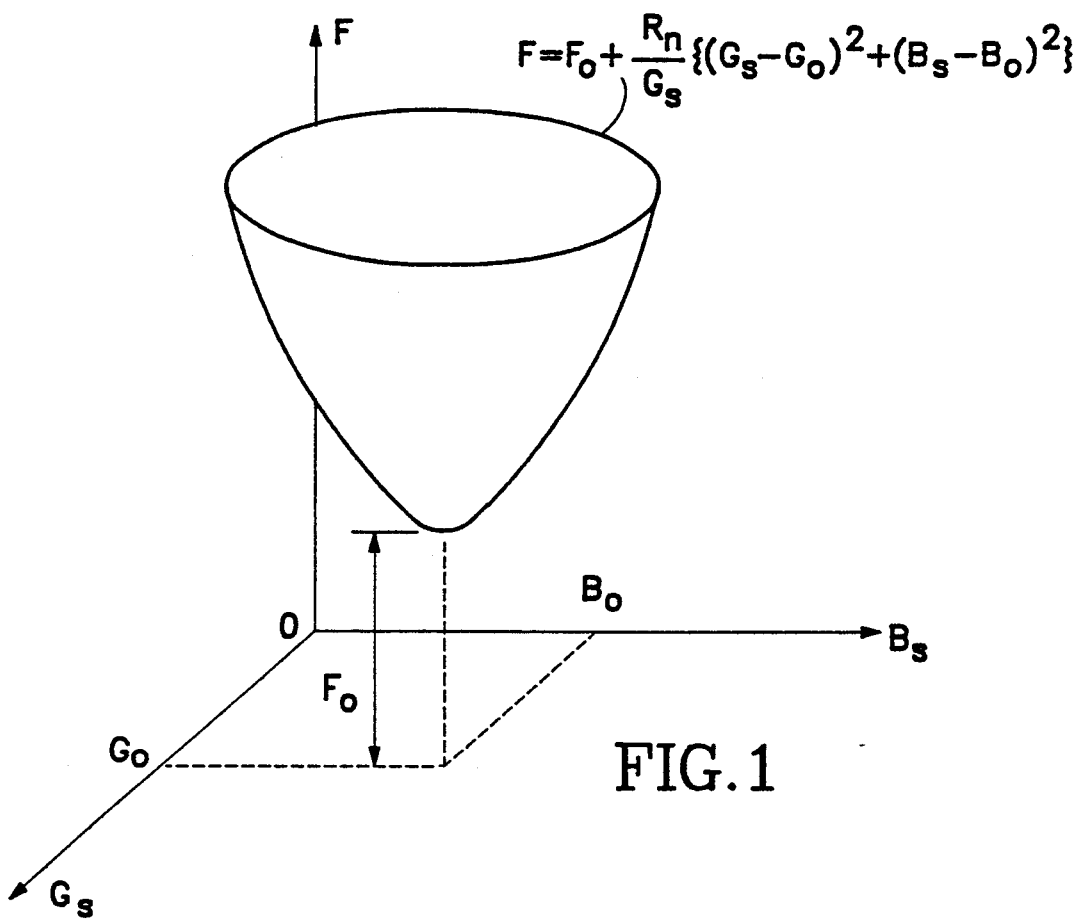
FIG. 1 is a graph of noise factor F on a rectangular source admittance plane.
Figure 2:
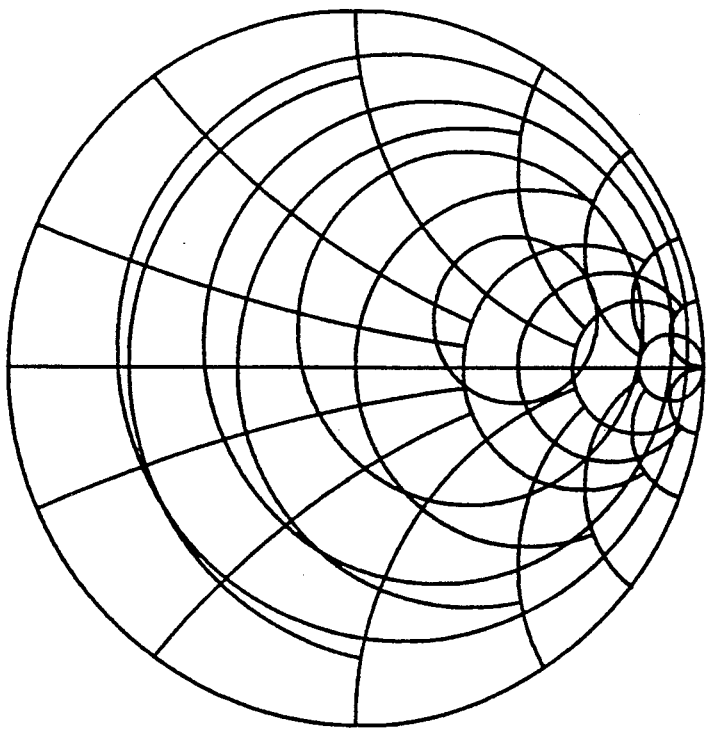
FIG. 2 is a Smith chart graph of source reflection coefficients which product constant noise factors F.
Figure 3:
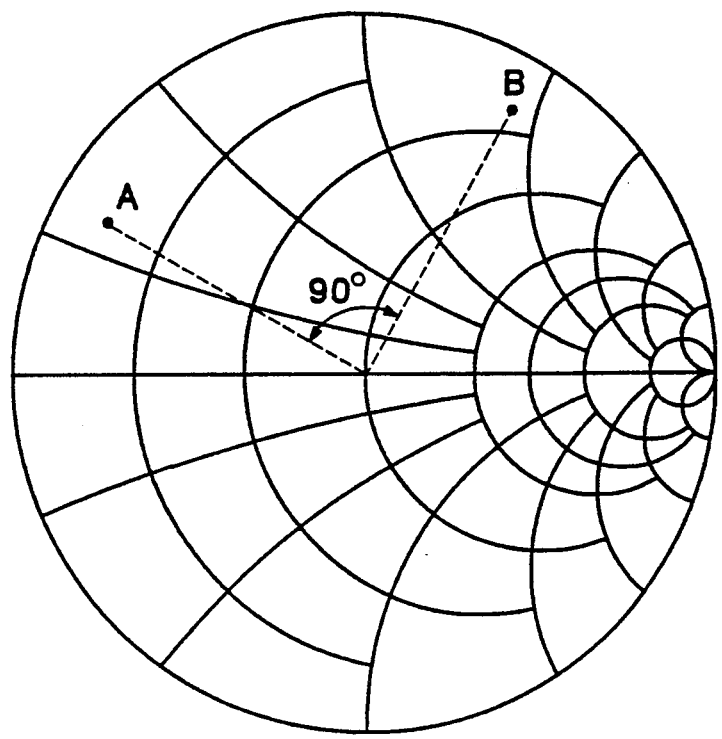
FIG. 3 is a graph of source admittance movement caused by frequency shift on a Smith chart.
Figure 4:
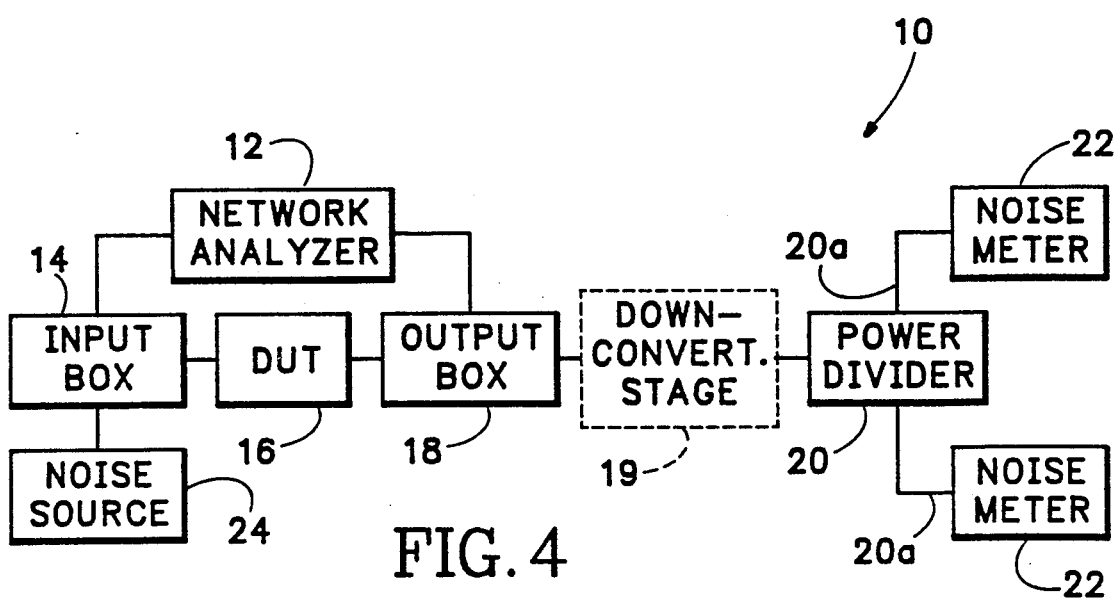
FIG. 4 is a block diagram of an exemplary system configuration for measuring the noise parameters of a two-port network according to the present invention.

Referring to the drawings, and with specific reference to FIG. 4, a block diagram of an exemplary noise parameter testing system 10 according to the present invention is shown. The system 10 comprises an automatic network analyzer 12, an input box 14, an output box 18, a power divider 20 having a plurality of outputs 20a, a plurality of noise meters 22 connected to respective outputs 20a of the power divider 20, and a calibrated noise source 24. The system may also comprise a down-conversion stage 19 between the output box 18 and the power divider 20. A device under test (DUT) 16 is connected between the input box 14 and the output box 18 for testing.

Figure 5:
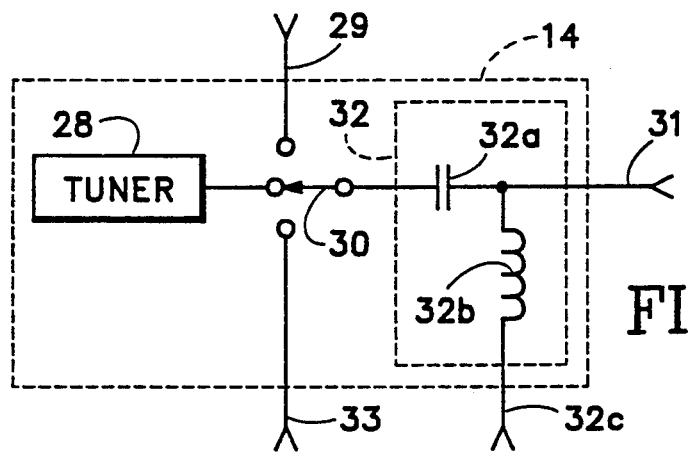
FIG. 5 is a diagram of an input box of the noise parameter measuring system of FIG. 4.

Referring now to FIG. 5, the input box 14 comprises a one-port tuner 28, a three-position switch 30, and an input bias circuit 32. The three-position switch 30 is connected to the input port of the DUT 16 via terminal 31 and may be selectively connected to the network analyzer 12 (FIG. 4) via terminal 29, the one-port tuner 28, or the noise source 24 (FIG. 4) via terminal 33. The input bias circuit 32 comprises a capacitor 32a and an inductor 32b, and is connected via terminal 32c to a variable DC bias source which may be adjusted to bias the DUT 16 for proper operation.

Figure 6:
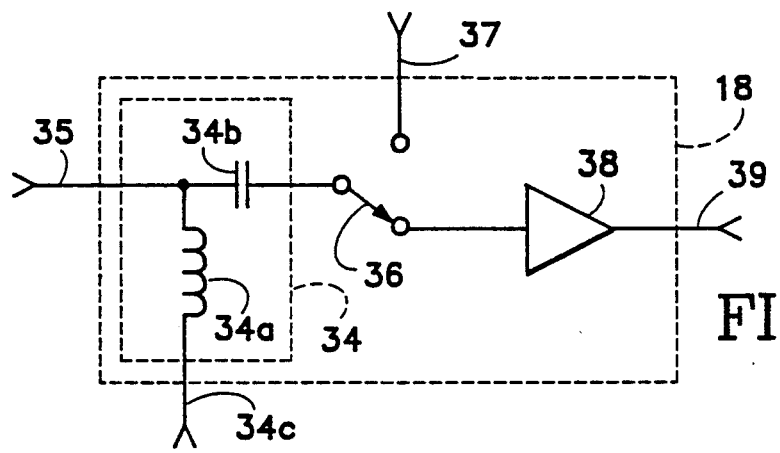
FIG. 6 is a diagram of an output box of the noise parameter measuring system of FIG. 4.

As shown in FIG. 6, the output box 18 comprises an output bias circuit 34, a two-position switch 36, and a low noise amplifier 38. The two-position switch 36 is connected so the output port of the DUT 16 (connected to terminal 35) may be selectively connected to either the network analyzer 12 via terminal 37 or the low-noise amplifier 38. The low-noise amplifier is connected to the power-divider 20 (FIG. 4) via terminal 39. The output bias circuit 34 comprises an inductor 34a and a capacitor 34b, and is connected via terminal 34c to a variable DC bias source which may be adjusted to bias the DUT 16 for proper operation.

Figure 7:
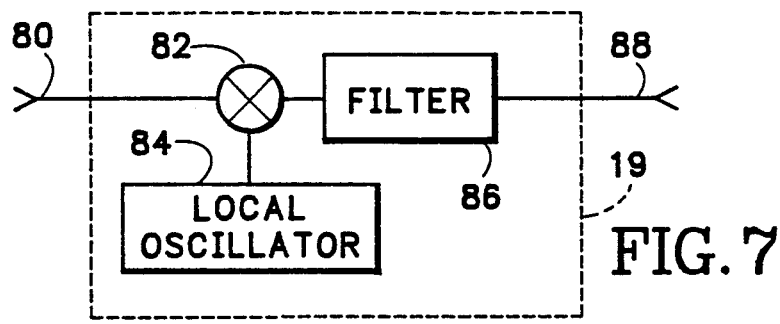
FIG. 7 is a block diagram of a down-conversion stage of the noise parameter measuring system of FIG. 4.

FIG. 7 shows the down-conversion stage 19 which may be included in the noise parameter testing system. The down-conversion stage 19 uses a local oscillator 84 tuned to a predetermined frequency and a mixer 82 to convert the frequency of the signal output from the output box (connected to terminal 80) to a lower frequency signal. A filter 86 connected to the output of the mixer 82 eliminates unwanted signal components from the mixer output. The output terminal 88 of the conversion stage 19 may be connected to another down-conversion stage, further altering the signal's frequency, or to the power divider 20 (FIG. 4).

Figure 8:
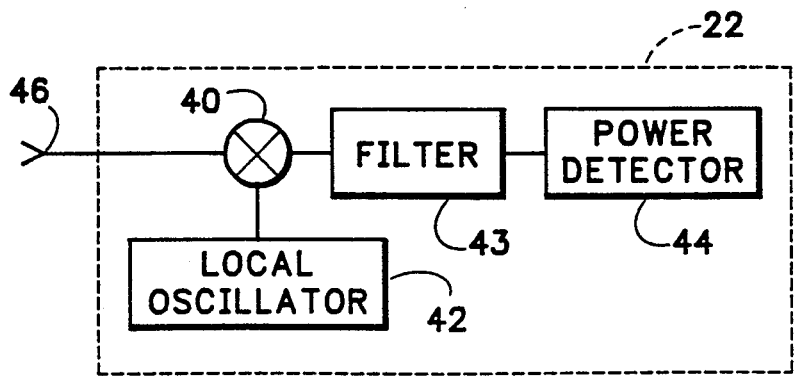
FIG. 8 is a block diagram of a noise figure meter of the noise parameter measuring system of FIG. 4.

Referring now to FIG. 8, each noise meter 22 may comprise a mixer 40, a local oscillator 42, a filter 43 and comprises a noise power detector 44. The mixer 40 and the local oscillator 42 may be used to transform the output signal from the power divider, received via terminal 46, from microwave frequencies to within a frequency range used by the noise power detector 44, either supplementing or replacing the function of down-conversion stage 19. A single local oscillator 84 may serve as an input for mixers 82 in different noise meters 19. The term "noise meter" is used herein to include both noise figure meters and noise power meters.

Each noise meter 22 is configured to measure noise power within different frequency ranges. The frequency ranges are closely spaced around a selected central frequency. As the noise performance of the DUT varies only slightly with respect to frequency, the simultaneous measurements may be used to calculate the DUT's noise parameters at the central frequency. In this manner, the noise meters 22 may measure concurrently the DUT's noise power for different source admittances. Also, in this manner, the noise meters 22 may measure concurrently the DUT's noise figure at many different frequencies when the DUT has a matched source impedance termination. It will be appreciated by those skilled in the art that more than two noise meters 22 may be used, each tuned to a different frequency, by using a power divider 20 (FIG. 4) which has more than two outputs 20a.

Figure 9:
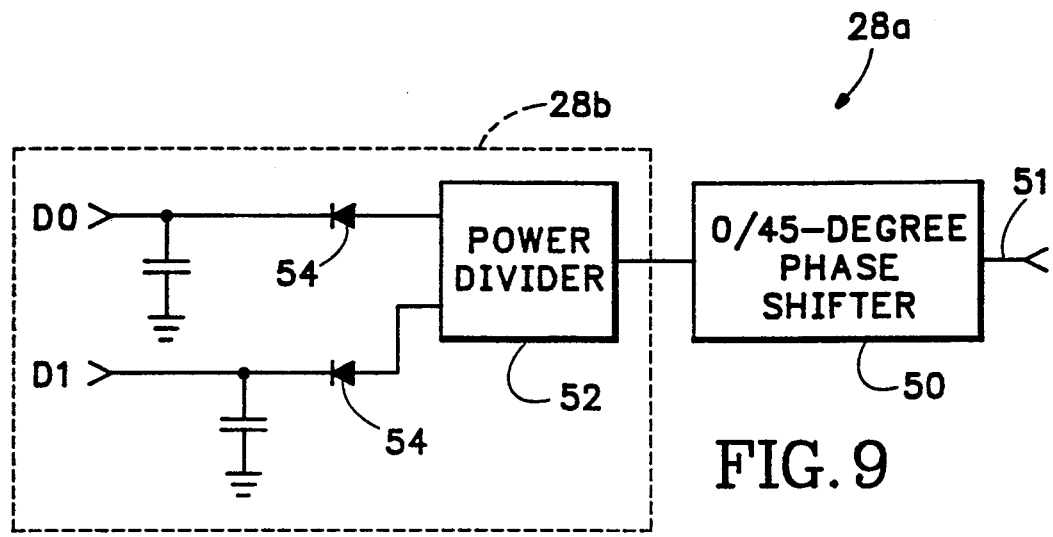
FIG. 9 is a diagram of an exemplary one-port tuner according to the present invention.

The one-port tuner 28 of the input box 14 may have several configurations. One such configuration 28a is shown in FIG. 9. A 0/45-degree phase shifter 50 is connected at one side via terminal 51 to the three-position switch 30 of the input box 14 (FIG. 5), and is connected at the other side to a power divider 52. The phase shifter 50 can selectively pass a signal straight through without change or shift its phase by 45 degrees. The power divider 52 has two outputs, each of which is connected to a PIN diode 54. The PIN diodes 54 are connected to data control lines D0, D1 which control the diodes' modes of operation. When the data lines are held low the diodes conduct, having the same characteristics as a low resistance resistor. When the data lines are held high, the diodes are reverse biased and have the same characteristics as a low capacitance capacitor. Changing the biases of the diodes, the reflection coefficients seen by the outputs of the power divider change. Leake U.S. Pat. No. 4,502,028 is hereby incorporated by reference to the extent that it is relevant in describing the operation of this tuner. One skilled in the art will recognize that mechanical switches, as well as the electronic ones shown, could be used to present various reflection coefficients to the output of the power divider 52.

Figure 10:
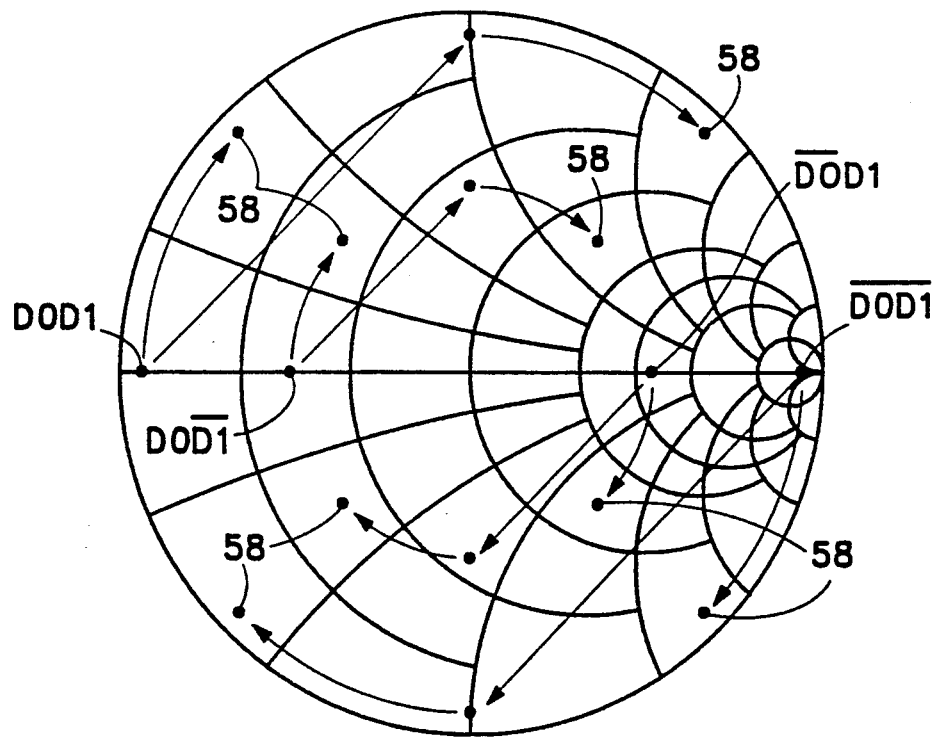
FIG. 10 is a Smith chart showing typical source admittances available from the one-port tuner of FIG. 9.

The reflection coefficients of this tuner seen by the DUT 16 for the four possible states of the data lines D0 and D1 and two phase shifter states are shown in FIG. 10. When the phase shifter passes signals straight through, the reflection coefficients are on the central horizontal line. When the phase shifter 90 shifts phases by 45 degrees, signals are shifted twice (both before and after being reflected), resulting in a 90-degree shift, also shifting the reflection coefficient 90 degrees to a vertical line through the center of the Smith chart. The measurement frequency also may be varied to achieve reflection coefficients not possible otherwise. For example, the frequency may be changed to rotate the measurement points by 45 degrees, resulting in measurement points 58.

Figure 11:
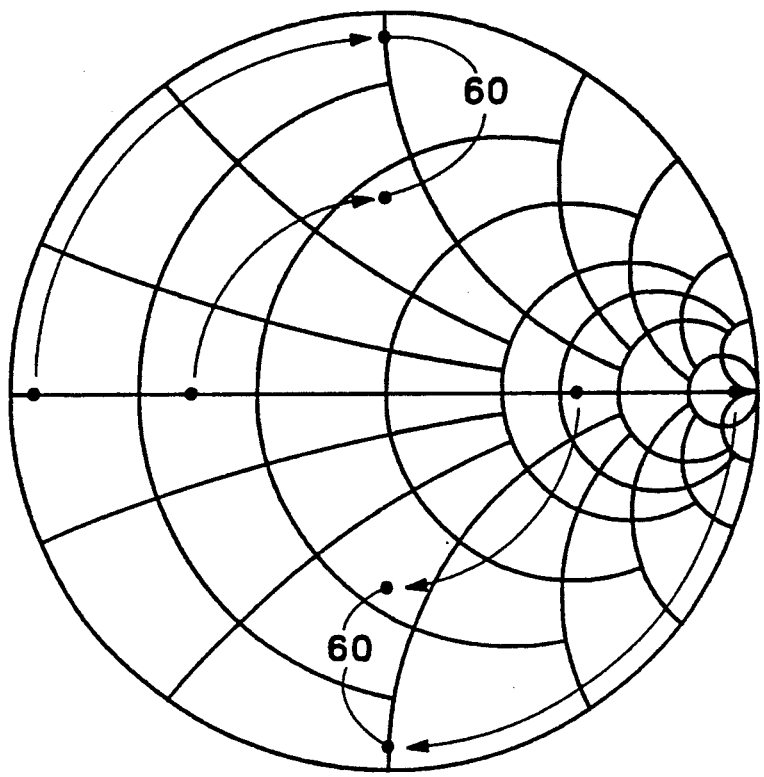
FIG. 11 is a Smith chart showing typical source admittances available from a portion of the one-port tuner of FIG. 9.

The one-port tuner 28a shown in FIG. 9 may also be used without the 0/45-degree phase shifter 50, including only the portion 28b enclosed within the dashed line. In this case, the power divider 52 is connected directly to the three-state switch 30 of the input box 14 (FIG. 5). The constellation of reflection coefficients possible from the one-port tuner 28b of FIG. 9 is shown in FIG. 11. Without frequency shift, the possible points are on the central horizontal line of the Smith chart and correspond to the measurement points of FIG. 10 without a phase or frequency shift. With a frequency shift, the reflection coefficient measurement points may be rotated around the center point of the Smith chart. For example, the measurement frequency may be increased to cause a 90-degree rotation yielding measurement points 60. Other rotations of the measurement points may be achieved through different changes in measurement frequency.

Figure 12:
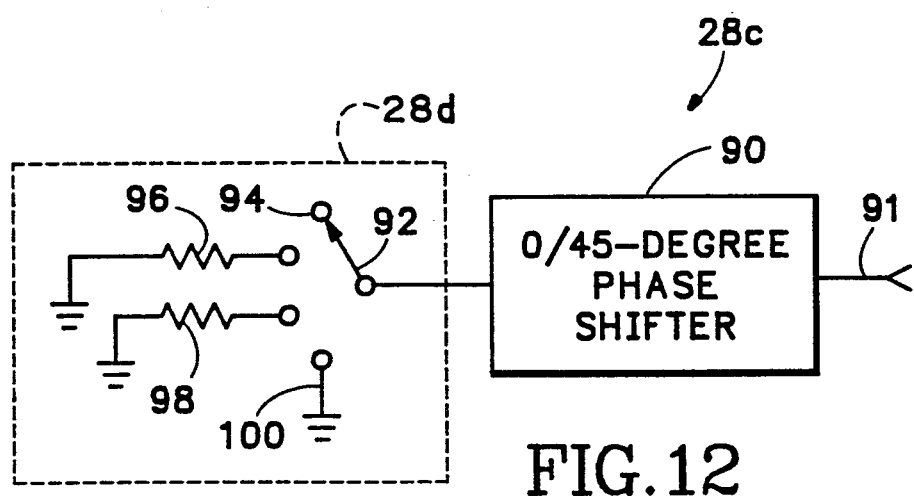
FIG. 12 is a diagram of a second exemplary embodiment of a one-port tuner according to the present invention.

Another one-port tuner 28c which may be used for the input box 14 is shown in FIG. 12. A 0/45-degree phase shifter 90 is connected at one side to the three-state switch 30 (FIG. 5) via terminal 91. The phase shifter's other side is connected to a multi-position switch 92, through which the phase shifter may be connected to different admittances, for example, an open circuit 94, 150 ohm resistor to ground 96, 15 ohm resistor to ground 98, and a short-circuit to ground 100. The phase shifter 90 can selectively pass a signal straight through without change or shift its phase by 45 degrees.

Figure 13:
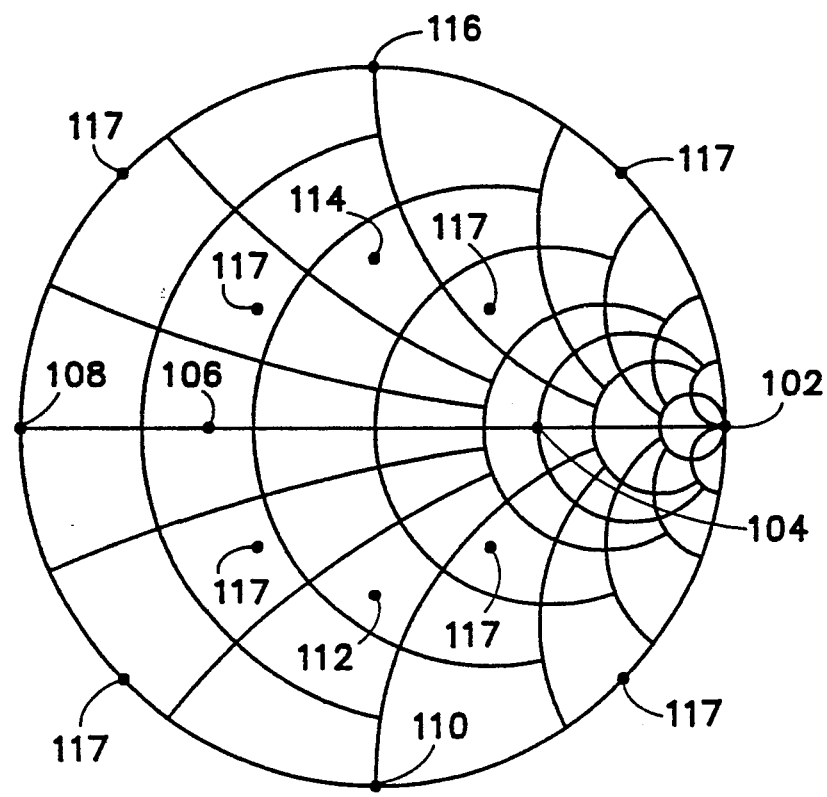
FIG. 13 is a Smith chart showing typical source admittances available from the one-port tuner of FIG. 12.

The constellation of reflection coefficients possible from the one-port tuner 28c of FIG. 12 is shown in FIG. 13. When the phase shifter 90 passes signals straight through, the tuner's possible reflection coefficients are on the Smith chart's central horizontal line. The open circuit maps to point 102, while the 150 ohm resistor, 15 ohm resistor, and closed circuit map to points 104, 106, and 108, respectively. When the phase shifter 90 shifts phases by 45 degrees, signals are shifted twice (both before and after being reflected), resulting in a total of 90 degrees shift, also shifting the reflection coefficient 90 degrees. Thus, the points for the open circuit, 150 ohm resistor, 15 ohm resistor, and closed circuit move 90 degrees to points 110, 112, 14 and 116, respectively. This tuner may be used with or without multiple measurement frequencies. If used with multiple measurement frequencies, the frequencies may be selected to rotate the reflection coefficient to points not achievable by the selected phase shifter. For example, a frequency shift may be used to rotate the points 45 degrees, yielding the measurement points 117. The noise parameter testing system of the present invention enables frequency-shifted measurements to be taken simultaneously with other measurements. One skilled in the art will appreciate the phase shifters 50 and 90 used in tuners 28a and 28c, respectively, need not shift phases by 45 degrees; other amounts of phase shift also would be advantageous. Furthermore, the phase shift may be either constant or increasing with frequency.

Figure 14:
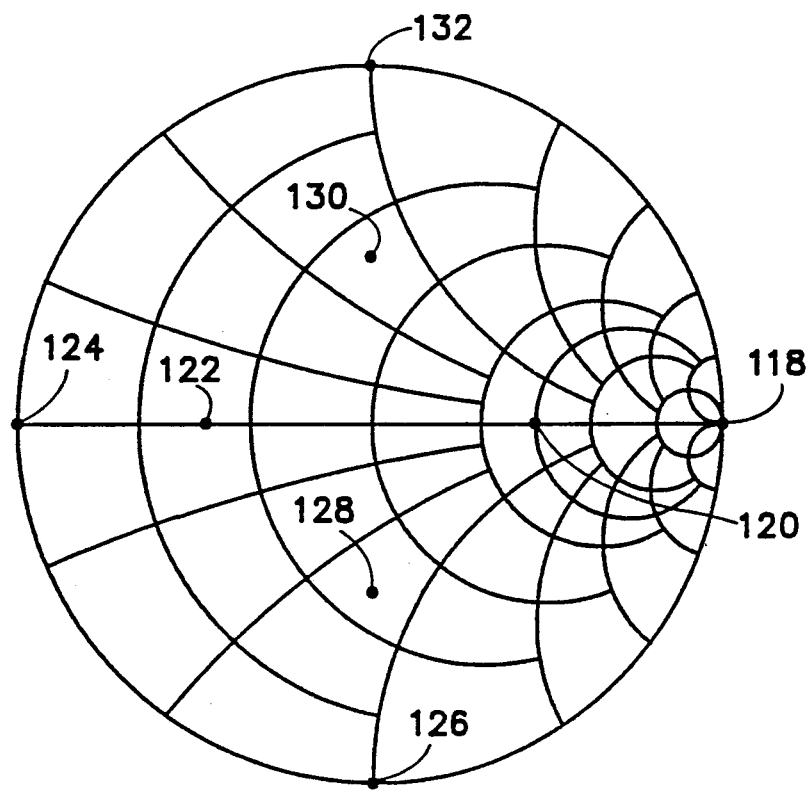
FIG. 14 is a Smith chart showing typical source admittances available from a portion of the one-port tuner of FIG. 12.

The one-port tuner 28c shown in FIG. 12 also may be used without the phase shifter 90, including only the portion 28d enclosed within the dashed line. In this case, the multi-state switch 92 is connected directly to the three-state switch 30 (FIG. 5) via terminal 91. The constellation of reflection coefficients possible from one-port tuner 28d of FIG. 12 is shown in FIG. 14. The points 118, 120, 122, and 124 correspond to open circuit, 150 ohm resistor, 15 ohm resistor, and closed circuit, respectively, exactly the same as shown in FIG. 13 for when the phase shifter is set to pass signals through without a phase shift. By varying the frequency at which the noise power is measured, the reflection coefficients rotate around the center point of the Smith chart, a 90-degree rotation being shown by points 126, 128, 130, and 132. The DUT's noise power may be measured simultaneously for these different source admittances using a power divider 20 and multiple noise meters 22 as shown in FIG. 4.

Figures 15, 16:
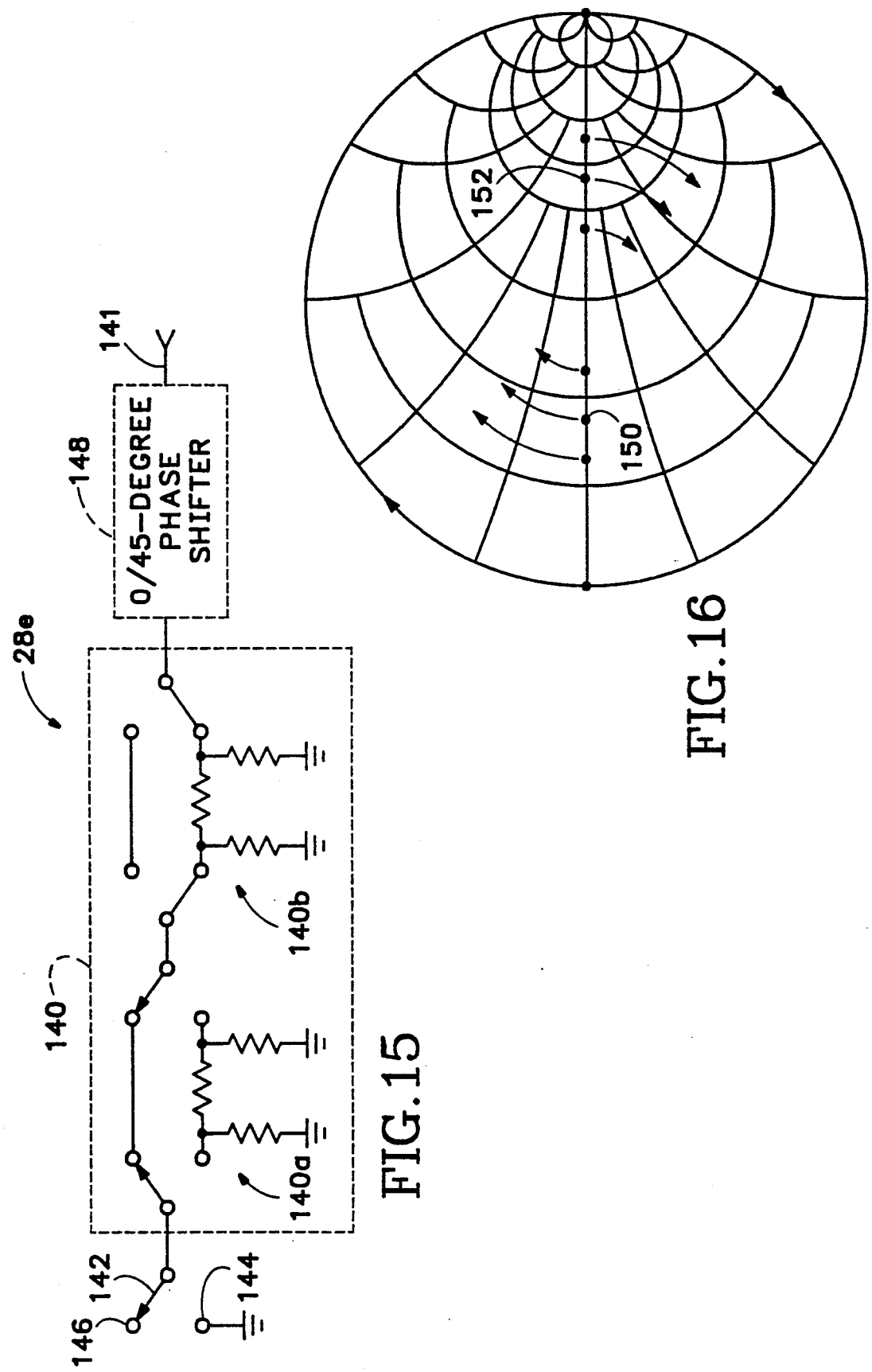
FIG. 15 is a schematic diagram of a third exemplary embodiment of a one-port tuner according to the present invention.
FIG. 16 is a Smith chart showing typical source admittances available from the one-port tuner of FIG. 15.

Another one-port tuner 28e for use in the input box 14 (FIG. 4) is shown in FIG. 15. A conventional two-bit attenuator 140, having a one-decibel stage 140a and a two-decibel stage 140b, is connected to the three-position switch 30 of the input box 14 (FIG. 5) via terminal 141. The other end of the attenuator 140 is connected to a switch 142 which allows selective connection to either a short-circuit to ground 144 or an open circuit 146. With the one-decibel stage 140a unselected and the two-decibel stage 140b selected (as shown in FIG. 15), there is a 4 dB attenuation of a reflected signal. This maps onto the Smith chart as points 150 or 152, shown in FIG. 16, the former when switch 146 is set to the short circuit to ground, the latter when switch 146 is set to the open circuit state. Attenuation of two, four, or six decibels is possible with different selections of the attenuator 140. Again, the points may be rotated around the center point on the Smith chart by varying the frequency at which the noise power is measured, as shown by the arrows in FIG. 16. One skilled in the art will appreciate other terminations may be used to supplement or replace the open and short circuit termination selectable by switch 146. One skilled in the art will also realize that a 0/45-degree phase shifter, having the same characteristics as described for phase shifters 50 (FIG. 9) and 90 (FIG. 12), may be interposed between the attenuator 140 and the terminal 141, with the result that the reflection coefficients shown on FIG. 16 rotate clockwise 90 degrees when the phase shifter 148 is selected to shift phases.

Figure 17:
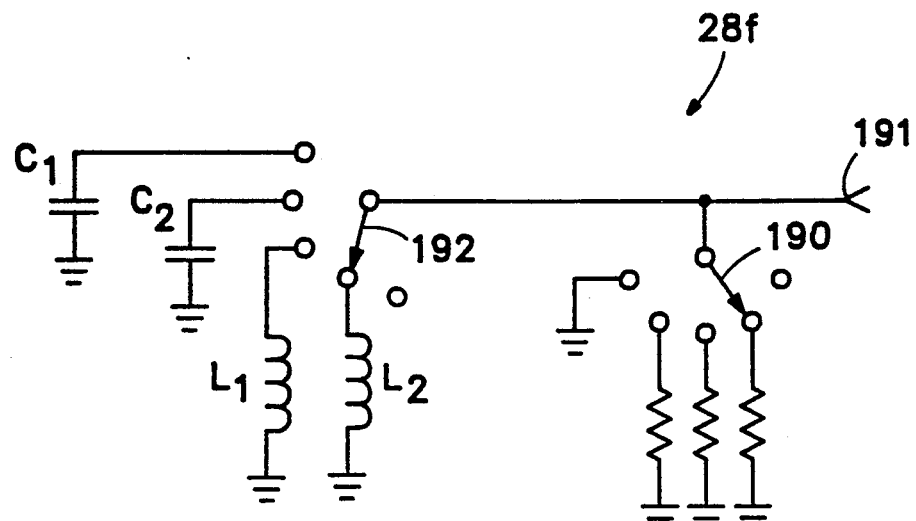
FIG. 17 is a schematic diagram of a fourth exemplary embodiment of a one-port tuner according to the present invention.
Figure 18:
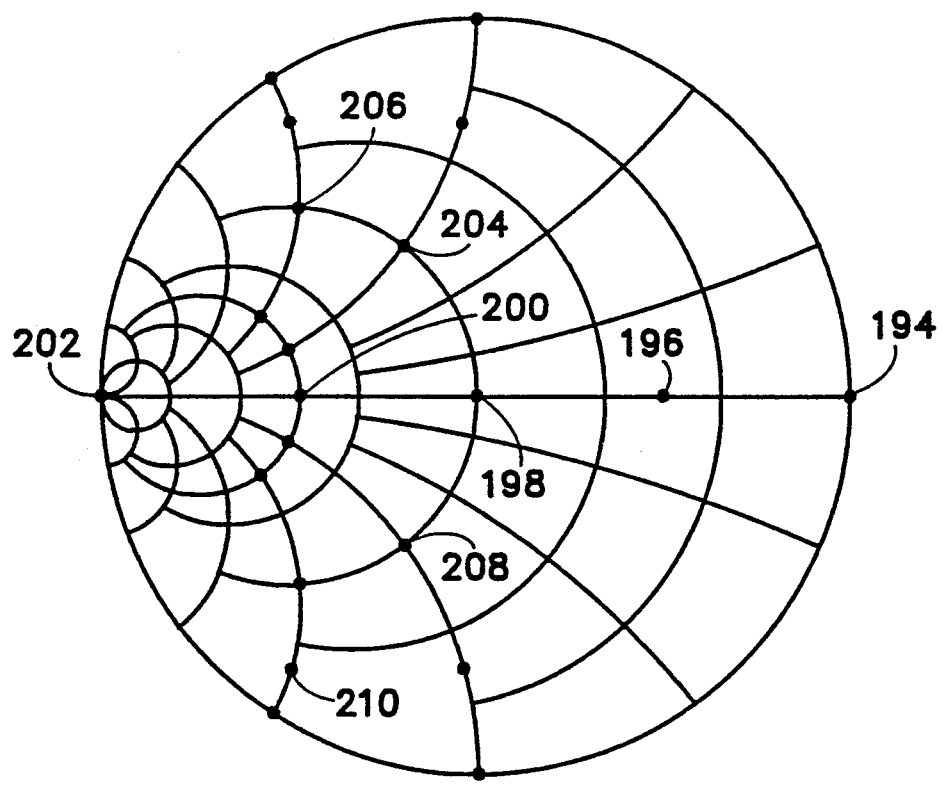
FIG. 18 is an admittance chart showing typical source admittances available from the one-port tuner of FIG. 17.

Another one-port tuner 28f for use with the noise parameter testing system of the present invention is shown in FIG. 17. Terminal 191 is connected to the DUT 16 via the three-position switch 30 (FIG. 5). In this tuner, two multi-position switches 190 and 192 are connected in parallel to the three-position switch 30 (FIG. 5) of the input box. The two switches 190 and 192 allows various predetermined resistances, e.g. open circuit, 150 ohms, 50 ohms, 15 ohms, and a short circuit, to be selected in parallel with various predetermined reactances, e.g. ±j50 ohms at the measurement frequencies. The constellation available from the one-port tuner 28f of FIG. 17 is shown in the admittance diagram in FIG. 18. When switch 192 selects an open-circuit state, the admittance of the tuner 28f is caused entirely by the position of switch 190. Points 194, 196, 198, 200, and 202 correspond to the tuner's admittance when switch 192 selects the open-circuit, 150-ohm resistor, 50-ohm resistor, 15-ohm resistor, and short-circuit. Switch 192 allows various complex admittances to be added in parallel, moving the measurement points along the constant conductance lines of the admittance chart. For example, when switch 192 selects inductor L1, inductor L2, capacitor C1, and capacitor C2, where inductor L1 has more inductance than inductor L2 and capacitor C1 has less capacitance than capacitor C2, the admittances are shown by points 204, 206, 208, and 210, respectively. Tuner 28f may be used with the measurement frequency shift technique which would allow multiple measurements to be taken simultaneously. One skilled in the art will appreciate the switches could be mechanical or electronic, such as diodes, and also that the possible states in FIG. 18 can also be achieved by using one multi-position switch.

Figure 19:
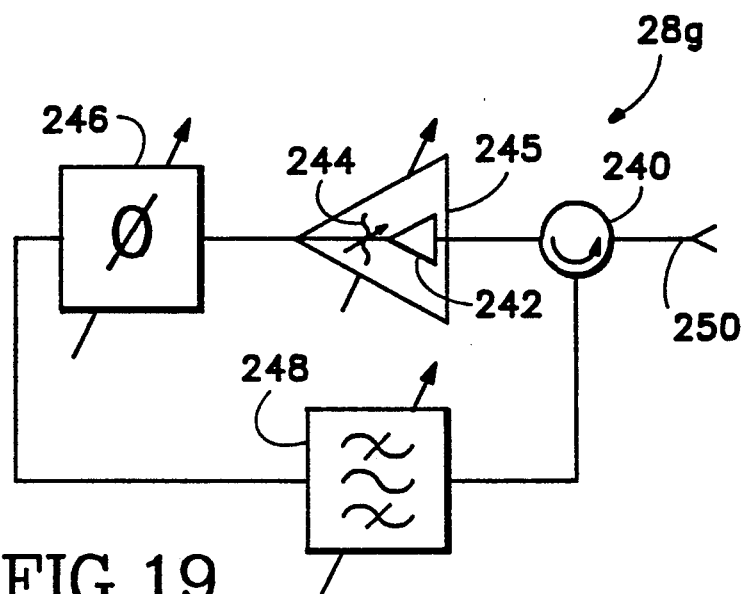
FIG. 19 is a block diagram of a fifth exemplary embodiment of a one-port tuner according to the present invention.
Figure 20:
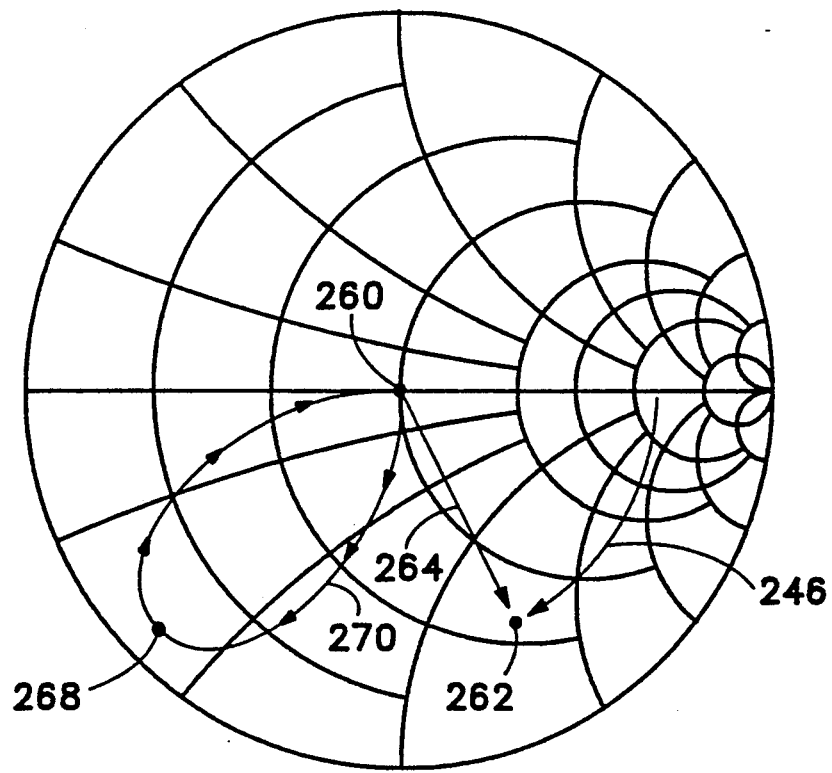
FIG. 20 is a Smith chart showing typical source admittances available from the one-port tuner of FIG. 19.

Another one-port tuner 28g is shown in FIG. 19 and its corresponding constellation in FIG. 20. The tuner 28g comprises a circulator 240, a variable gain amplifier 245, a variable phase shifter 246, and a variable bandpass filter 248. The circulator 240 is connected so all signals received from the DUT 16 via terminal 250 are passed to the amplifier 245, and all signals received from the variable bandpass filter 248 are passed to the DUT. For realization of the tuner 28g using actual circuitry, a fixed gain amplifier 242 and a variable attenuator 244 may replace the variable gain amplifier 245. Assume for purposes of explanation that the bandpass filter 248 passes all signals without attenuation or phase shift. Then any arbitrary reflection coefficient (as seen by the DUT) could be achieved by varying the gain of the variable amplifier and the shift caused by the variable phase shifter 246. If the gain of the amplifier 245 is zero, no signal is returned to the DUT, resulting in a reflection coefficient of zero, or a matched impedance, as shown by point 260 in FIG. 20. If the amplifier 245 has unity gain, the resulting reflection coefficient will be on the perimeter of the Smith chart, its phase determined by the amount of shift caused by phase shifter 246. Furthermore, if the amplifier 245 has gain greater than unity, the reflection coefficient will be outside the unity circle of the Smith chart; this situation is useful to counteract any attenuation between the tuner 28g and the DUT. Thus, for an arbitrary point 262 (FIG. 20), the magnitude 264 of the reflection coefficient is determined by the gain of the amplifier 245, and the phase 266 is determined by the shift caused by phase shifter 246.

The bandpass filter 248 attenuates all signals outside its passband which preferably is centered on the measurement frequency of the noise meter 22 (FIG. 4). For example, assume the amplifier 245 and phase shifter 246 are set for reflection coefficient shown by point 268. The variable bandpass filter 248 blocks all signals outside its passband, resulting in a reflection coefficient of zero, as shown by point 260. The filter 248 passes signals within its passband and returns them to the DUT. Line 270 represents the path of the reflection coefficient with increasing frequency, point 268 representing the reflection coefficient at the center of the passband. The bandpass filter 248 allows the tuner to have an arbitrary desired reflection coefficient at the measurement frequency and a zero reflection coefficient elsewhere. This allows instability regions of the DUT to be avoided.

Figure 21:
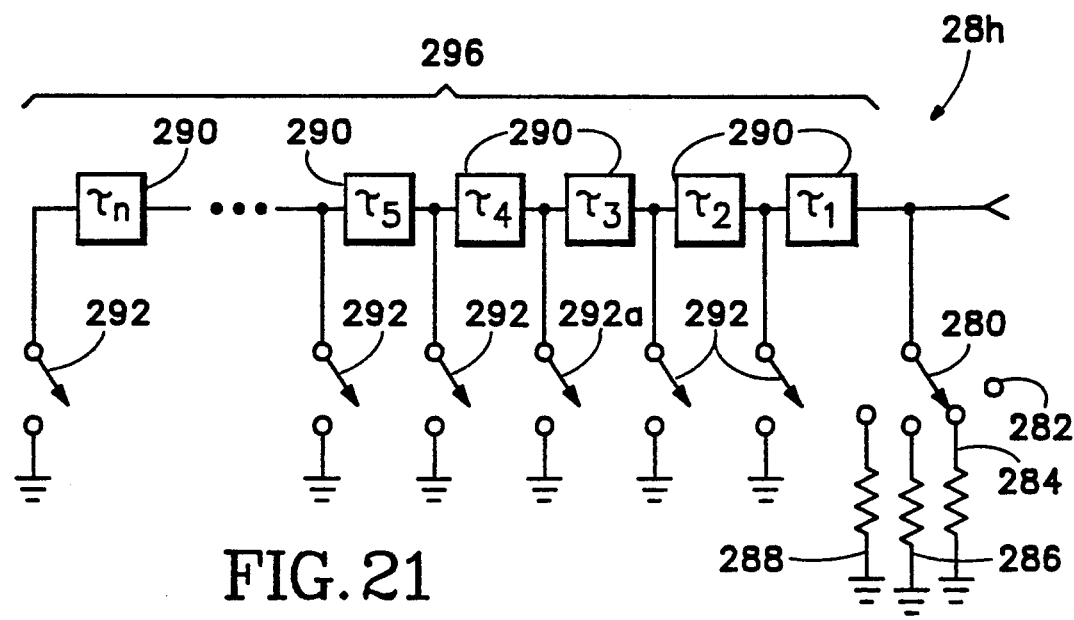
FIG. 21 is a schematic diagram of a sixth exemplary embodiment of a one-port tuner according to the present invention.
Figure 22:
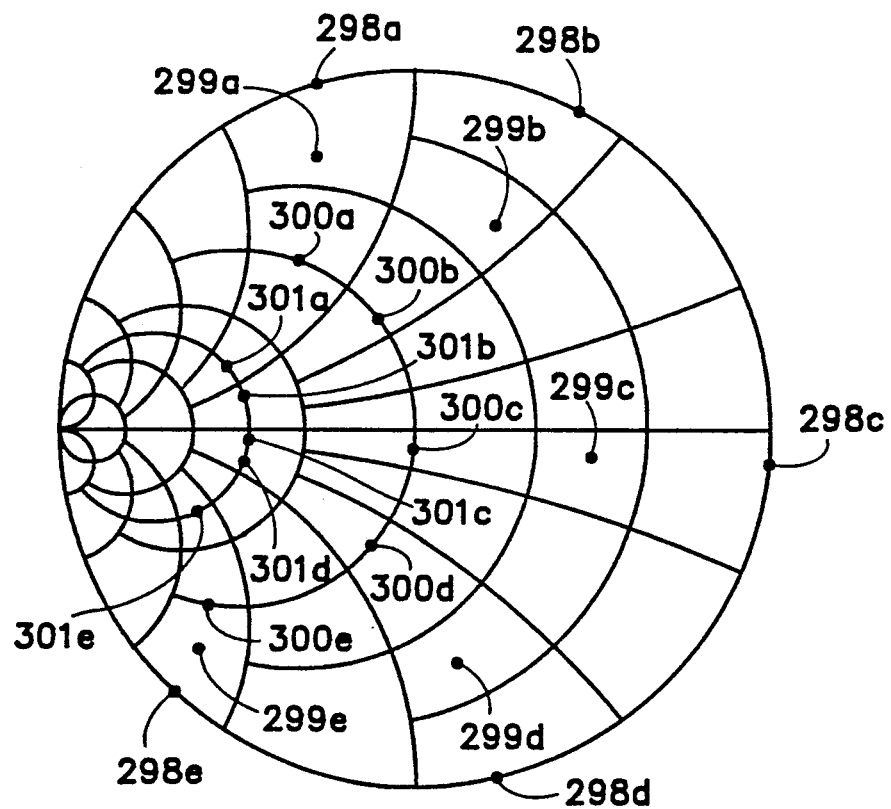
FIG. 22 is an admittance chart showing typical source admittances available from the one-port tuner of FIG. 21.

Another one-port tuner 28h is shown in FIG. 21 and is somewhat similar to the tuner 28f of FIG. 17. This tuner 28h comprises a multi-position switch 280 which allows selection of various admittances, e.g., open circuit 282, 15 ohm resistor 284, 50 ohm resistor 286, and 150 ohm resistor 288. The tuner also comprises a series of delay circuits 290 having switches to ground 292 therebetween. The delay circuits 290 and switch 292 cooperate to provide a variable length transmission line 296. By closing switch 292a, the transmission line 296 is effectively a shorted stub of length $1+2+3$. Different effective lengths of shorted stubs are available by closing a different switch 292. As the measurement frequency increases, a given variation in length of transmission line 296 has an increasing phase shift effect. The delay circuits 290 may be arranged in increasing delay, to counter this effect. The resistors 284, 286, and 288 may be alternately selected in parallel with the transmission line 296 to provide a broader constellation of measurement points shown in FIG. 22. The points around the perimeter of the Smith chart, shown as points 298a-298e, depict exemplary coefficients achievable when switch 280 selects open circuit 282. The different rotations around the chart are caused by different effective lengths of the transmission line 296. The points within the interior of the Smith chart show exemplary reflection coefficients corresponding to the effective lengths of transmission line 296 in parallel with different conductances selected by switch 280. Points 299a-299e represent reflection coefficients achievable with the 150 ohm resistor 288 selected. Likewise, points 300a-300e and 301a-301e represent exemplary reflection coefficients achievable with the 50 ohm resistor 286 and the 15 ohm resistor 284 selected, respectively. A change in the measurement frequency rotates the shown points around the center of the Smith chart.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. In combination with a noise meter adapted to connect to a device under test to form a noise parameter system for testing the noise performance of said device under test, a one-port tuner comprising:
   (a) a source port adapted to connect to said device under test;
   (b) two termination admittance means for providing a plurality of predetermined admittances;
   (c) two switching means for selecting one of said plurality of predetermined admittances, each of said switching means operatively associated with a respective one of said termination admittance means;
   (d) a power divider having one input terminal and two output terminals, each of said output terminals connected to a respective one of said switching means; and
   (e) a phase shifter means having two ports for selectively shifting the phase of signals passing therethrough by a predetermined amount, a first of said ports of said phase shifter connected to said input terminal of said power divider and a second of said ports of said phase shifter connected to said source port, said phase shifter selectable whether to shift phases by said predetermined amount.

2. In combination with a noise meter adapted to connect to a device under test to form a noise parameter system for testing the noise performance of said device under test, a one-port tuner comprising:
   (a) a source port adapted to connect to said device under test;
   (b) two termination admittance means for providing a plurality of predetermined admittances;
   (c) switching means having an output port for selectively connecting one of said plurality of predetermined admittances to said output port; and
   (d) a selectable phase shifter means for selectively shifting the phase of signals passing therethrough by a predetermined amount, and wherein said output port of said switching means is connected to said source port via said phase shifter, said phase shifter selectable whether to shift phases by a predetermined amount.

3. In combination with a noise meter adapted to connect to a device under test to form a noise parameter system for testing the noise performance of said device under test, a one-port tuner comprising:
   (a) a source port adapted to connect to said device under test;
   (b) multiple-state attenuator means having two ports for selectively attenuating a signal passing therethrough, said attenuating selectable in degree, a first of said ports of said attenuator means connected to said source port;
   (c) termination admittance means for providing a plurality of predetermined admittances; and
   (d) switching means for selectively connecting one of said termination admittance means to a second of said ports of said attenuator means.

4. The one-port tuner of claim 3, further comprising a selectable phase shifter means for selectively shifting the phase of signals passing therethrough by a predetermined amount, and wherein said first of said ports of said attenuator means is connected to said source port via said phase shifter, said phase shifter selectable whether to shift phases by a predetermined amount.

5. The one-port tuner of claims 1, 2, 3, or 4, wherein said plurality of predetermined admittances includes:
   (a) an open circuit; and
   (b) a short-circuit.

6. The one-port tuner of claims 1, 2, 3, or 4, wherein said plurality of predetermined admittances includes a predetermined resistance.

7. The one-port tuner of claims 1, 2, 3, or 4, wherein said plurality of predetermined admittances includes a lumped reactance.

8. The one-port tuner of claims 1, 2, 3, or 4, wherein said plurality of predetermined admittances includes a distributed reactance.

9. In combination with a noise meter adapted to connect to a device under test to form a noise parameter system for testing the noise performance of said device under test, a one-port tuner comprising:
   (a) a source port adapted to connect to said device under test;
   (b) a circulator having a first terminal, a second terminal, and a third terminal, said second terminal of said circulator adapted to be connected to said device under test;
   (c) a variable amplifier having an input terminal connected to said third terminal of said circulator and having an output terminal;
   (d) a variable phase shifter having an input terminal connected to said output terminal of said variable amplifier and having an output terminal;
   (e) a variable bandpass filter having an input terminal connected to said output terminal of said variable phase shifter and having an output terminal connected to said first terminal of said circulator.

10. In combination with a noise meter adapted to connect to a device under test to form a noise parameter system for testing the noise performance of said device under test, a one-port tuner comprising:
   (a) a source port adapted to connect to said device under test;
   (b) signal feedthrough means having a first terminal, a second terminal, and a third terminal, for passing signals from said first terminal to said second terminal and from said second terminal to said third terminal, said second terminal of said single feedthrough means adapted to be connected to said device under test;
   (c) a variable amplifier having an input terminal connected to said third terminal of said signal feedthrough means and having an output terminal;
   (d) a variable phase shifter having an input terminal connected to said output terminal of said variable amplifier and having an output terminal;
   (e) a variable bandpass filter having an input terminal connected to said output terminal of said variable phase shifter and having an output terminal connected to said first terminal of said signal feedthrough means.

* * * * *

UNITED STATES PATENT AND TRADEMARK OFFICE
CERTIFICATE OF CORRECTION

PATENT NO. : 5,068,615

DATED : November 26, 1991

INVENTOR(S) : Eric W. Strid, et al

It is certified that error appears in the above-identified patent and that said Letters Patent is hereby corrected as shown below:

Col. 10, claim 2, line 27, delete "two".

Signed and Sealed this

Twenty-fourth Day of August, 1993

Attest:

BRUCE LEHMAN

Attesting Officer     Commissioner of Patents and Trademarks